(12) United States Patent
Park et al.

(10) Patent No.: US 10,707,432 B2
(45) Date of Patent: Jul. 7, 2020

(54) PHOTOELECTRONIC DEVICE AND IMAGE SENSOR

(71) Applicant: Samsung Electronics Co., Ltd., Suwon-Si, Gyeonggi-Do (KR)

(72) Inventors: Kyung Bae Park, Hwaseong-si (KR); Kyu Sik Kim, Yongin-si (KR); Kwang Hee Lee, Yongin-si (KR); Dong-Seok Leem, Hwaseong-si (KR); Seon-Jeong Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/186,075

(22) Filed: Feb. 21, 2014

(65) Prior Publication Data

US 2014/0239278 A1    Aug. 28, 2014

(30) Foreign Application Priority Data

Feb. 22, 2013  (KR) .................. 10-2013-0019422

(51) Int. Cl.
*H01L 51/44* (2006.01)
*H01L 27/30* (2006.01)

(52) U.S. Cl.
CPC .......... *H01L 51/441* (2013.01); *H01L 27/307* (2013.01); *H01L 51/442* (2013.01); *Y02E 10/549* (2013.01); *Y02P 70/521* (2015.11)

(58) Field of Classification Search
CPC ............................ H01L 51/441; H01L 27/307
USPC .......... 257/40, 79, 53, 59, 458, 436; 438/59, 438/46, 29
See application file for complete search history.

(56) References Cited

U.S. PATENT DOCUMENTS

| | | | | |
|---|---|---|---|---|
| 4,650,524 A | * | 3/1987 | Kiyama | H01L 31/03921 136/244 |
| 5,179,471 A | * | 1/1993 | Caskey et al. | 359/603 |
| 5,759,725 A | * | 6/1998 | Hirao | B82Y 10/00 430/130 |
| 6,734,515 B1 | * | 5/2004 | Tadatomo et al. | 257/431 |
| 7,078,856 B2 | * | 7/2006 | Fujii | 313/508 |

(Continued)

FOREIGN PATENT DOCUMENTS

| | | |
|---|---|---|
| EP | 1076368 A2 | 2/2001 |
| EP | 1970959 A2 | 9/2008 |

(Continued)

OTHER PUBLICATIONS

European Search Report dated Jun. 2, 2014 for corresponding European Application No. 14156095.3.

(Continued)

*Primary Examiner* — Sheng-Bai Zhu
(74) *Attorney, Agent, or Firm* — Harness, Dickey & Pierce, P.L.C.

(57) ABSTRACT

Disclosed are a photoelectronic device including a first electrode including a first metal; an active layer disposed between the first electrode and a second electrode; and a diffusion barrier layer disposed between the first electrode and the active layer; the diffusion barrier layer including a second metal, wherein the second metal has a thermal diffusivity that is lower than a thermal diffusivity of the first metal, and wherein the first electrode and the diffusion barrier layer are configured to transmit light, and an image sensor including the photoelectronic device.

7 Claims, 6 Drawing Sheets

(56) References Cited

U.S. PATENT DOCUMENTS

| | | | |
|---|---|---|---|
| 7,157,156 B2 | 1/2007 | Raychaudhuri et al. | |
| 7,760,254 B2* | 7/2010 | Suzuki | 348/272 |
| 7,875,947 B2 | 1/2011 | Moon et al. | |
| 8,338,901 B2 | 12/2012 | Ueno et al. | |
| 9,279,913 B2 | 3/2016 | Wakizaka et al. | |
| 2002/0109458 A1 | 8/2002 | Pichler et al. | |
| 2004/0031965 A1* | 2/2004 | Forrest | H01L 27/288 257/79 |
| 2005/0029525 A1* | 2/2005 | Wu | 257/79 |
| 2005/0122417 A1 | 6/2005 | Suzuki | |
| 2005/0139825 A1* | 6/2005 | Song | H01L 33/32 257/44 |
| 2005/0208330 A1 | 9/2005 | Raychaudhuri et al. | |
| 2005/0274964 A1* | 12/2005 | Huang | H01L 33/14 257/94 |
| 2008/0213621 A1* | 9/2008 | Takashima | H05B 33/10 428/690 |
| 2008/0230123 A1* | 9/2008 | Mitsui | C09B 23/0066 136/263 |
| 2008/0284325 A1* | 11/2008 | Noh | H01L 51/0052 313/504 |
| 2008/0315198 A1* | 12/2008 | Jung | 257/53 |
| 2010/0032736 A1* | 2/2010 | Sudo | H01L 27/14621 257/294 |
| 2010/0102303 A1 | 4/2010 | Nomura et al. | |
| 2010/0123126 A1* | 5/2010 | Kitamura | H01L 51/5231 257/40 |
| 2010/0237384 A1* | 9/2010 | Choo et al. | 257/103 |
| 2010/0246014 A1 | 9/2010 | Asahi et al. | |
| 2011/0089440 A1* | 4/2011 | Park | H01L 25/0756 257/88 |
| 2011/0114984 A1* | 5/2011 | Seong | 257/98 |
| 2011/0156104 A1* | 6/2011 | Yamaguchi | H01L 27/14603 257/222 |
| 2012/0181526 A1 | 7/2012 | Kasahara et al. | |
| 2012/0313088 A1* | 12/2012 | Yofu | B82Y 10/00 257/40 |
| 2013/0048060 A1* | 2/2013 | Akiike | C23C 14/08 136/252 |
| 2014/0054577 A1 | 2/2014 | Mitsui et al. | |

FOREIGN PATENT DOCUMENTS

| | | |
|---|---|---|
| JP | S61113066 A | 5/1986 |
| JP | H02-086170 A | 3/1990 |
| JP | H0294566 A | 4/1990 |
| JP | H03257972 A | 11/1991 |
| JP | H10247746 A | 9/1998 |
| JP | 2000-214664 A | 8/2000 |
| JP | 2002-43590 A | 2/2002 |
| JP | 2005-142510 A | 6/2005 |
| JP | 2005-277311 A | 10/2005 |
| JP | 2007-067194 A | 3/2007 |
| JP | 2007-219515 A | 8/2007 |
| JP | 2008244296 A | 10/2008 |
| JP | 2010-100575 A | 5/2010 |
| JP | 2010-152311 A | 7/2010 |
| JP | 2010-256880 A | 11/2010 |
| JP | 2011-100753 A | 5/2011 |
| JP | 2011-151126 A | 8/2011 |
| JP | 2011-175252 A | 9/2011 |
| JP | 2011238781 A | 11/2011 |
| KR | 2006-0129058 A | 12/2006 |
| KR | 2007-0003441 A | 1/2007 |
| WO | WO-2012/170457 A2 | 12/2012 |
| WO | WO-2012/170457 A3 | 3/2013 |

OTHER PUBLICATIONS

Jan Meiss et al., "Optimizing the morphology of metal multilayer films for indium tin oxide (ITO)-free inverted organic solar cells", Journal of Applied Physics, American Institute of Physics, vol. 105, No. 6, Mar. 25, 2009.

Japanese Office Action dated Sep. 5, 2017 for corresponding Japanese Application No. JP2014-032591.

Japanese Office Action for corresponding Japanese Application No. 2014-032591 dated Mar. 6, 2018.

"Optimizing the morphology of metal multilayer films for indium tin oxide (ITO)-free inverted organic solar cells", American Institute of Physics, Journal of Applied Physics, 105, 6, 63108.

Japanese Office Action dated Sep. 4, 2018 in corresponding Japanese Patent Application No. 2014-032591, with corresponding English translation.

Chinese Office Action dated Jun. 19, 2018 in corresponding Chinese Application No. 201410062108.3.

Japanese Decision to Decline Amendment for Application No. 2014-032591, dated Jun. 4, 2019, English translation thereof.

European Office Action for corresponding Application No. 14156095.3, dated Sep. 18, 2019.

Korean Office Action for corresponding Application No. 10-2013-0019422, dated Nov. 29, 2019, English translation thereof.

Japanese Notice of Allowance for corresponding Application 10-2014-032591. dated Feb. 24, 2019, English translation thereof.

* cited by examiner

PHOTOELECTRONIC DEVICE AND IMAGE SENSOR

This application claims priority from Korean Patent Application No. 10-2013-0019422 filed in the Korean Intellectual Property Office on Feb. 22, 2013, the entire contents of which are incorporated herein by reference.

BACKGROUND

Field

A photoelectronic device and an image sensor are disclosed according to various example embodiments.

A photoelectronic device refers to a device for converting light into an electrical signal. The photoelectronic device may include a photodiode, a phototransistor, and the like, and may be applied to an image sensor, a solar cell, and the like.

In general, an image sensor including a photodiode requires higher resolution and accordingly a smaller pixel. At present, a silicon photodiode is widely used, but typically presents a problem of deteriorated sensitivity, because a silicon photodiode has a smaller absorption area due to smaller pixels. Accordingly, research on an organic materials capable of replacing silicon has been undertaken.

Organic materials typically have a high extinction coefficient and selectively absorb light in a particular wavelength region depending on a molecular structure, and thus may simultaneously replace a photodiode and a color filter and resultantly improve sensitivity and contribute to high integration.

In order to implement a photodiode using the organic material, photoelectric conversion efficiency is required to be increased, and for this purpose, charge mobility between an electrode and an active layer may need to be increased. In addition, when the photodiode may be applied to an image sensor, the photodiode may have a low current in a reverse bias state, that is, a low leakage current, and may sense a current value generated by light, and thus increase sensing performance of the image sensor.

SUMMARY

One example embodiment provides a photoelectronic device that may improve photoelectric conversion efficiency and decrease a leakage current.

Another example embodiment provides an image sensor including the photoelectronic device.

According to at least one example embodiment, a photoelectronic device may include a first electrode including a first metal; an active layer disposed between the first electrode and a second electrode; and a diffusion barrier layer disposed between the first electrode and the active layer; the diffusion barrier layer including a second metal, wherein the second metal has a thermal diffusivity that is lower than a thermal diffusivity of the first metal, and wherein the first electrode and the diffusion barrier layer are configured to transmit light.

According to at least one example embodiment, the first metal may include silver (Ag), gold (Au), chromium (Cr), germanium (Ge), an alloy thereof, or a combination thereof.

According to at least one example embodiment, the second metal may be selected from a metal having thermal diffusivity of less than or equal to about $10^{-5}$ m$^2$/s.

According to at least one example embodiment, the second metal may include aluminum (Al), nickel (Ni), cobalt (Co), ruthenium (Ru), palladium (Pd), an alloy thereof, or a combination thereof.

According to at least one example embodiment, the first metal may include silver (Ag) or a silver alloy, and the second metal may include aluminum (Al) or an aluminum alloy.

According to at least one example embodiment, the first electrode may have a thickness of about 1 nm to about 500 nm.

According to at least one example embodiment, the diffusion barrier layer may have a thickness of about 0.5 nm to about 10 nm.

According to at least one example embodiment, the photoelectronic device may further include a light transmission auxiliary layer, wherein the light transmission auxiliary layer may include a material having a refractive index of about 1.6 to about 2.5.

According to at least one example embodiment, a light transmittance of the photoelectronic device may be equal to or greater than 80%.

According to at least one example embodiment, a dark current of the photoelectronic device may be equal to or less than 100 e/s.

According to another example embodiment, an organic image sensor may include an array of photo-sensing devices; an array of color filters; and a photoelectronic device; wherein the photoelectronic device includes, a first electrode including a first metal and transmitting incident light, an active layer disposed between the first electrode and a second electrode, and a diffusion barrier layer including a second metal, disposed between the first electrode and the active layer and configured to transmit light, wherein a thermal diffusivity of the second metal is lower than a thermal diffusivity of the first metal.

According to at least one example embodiment, the first metal may include silver (Ag), gold (Au), chromium (Cr), germanium (Ge), an alloy thereof, or a combination thereof.

According to at least one example embodiment, the second metal may include a metal having thermal diffusivity of less than or equal to about $10^{-5}$ m$^2$/s.

According to at least one example embodiment, the second metal may include aluminum (Al), nickel (Ni), cobalt (Co), ruthenium (Ru), palladium (Pd), an alloy thereof, or a combination thereof.

According to at least one example embodiment, the first electrode may have a thickness of about 1 nm to about 500 nm.

According to at least one example embodiment, the diffusion barrier layer may have a thickness of about 0.5 nm to about 10 nm.

According to at least one example embodiment, the organic image sensor may further include a light transmission auxiliary layer, wherein the light transmission auxiliary layer comprises a material having a refractive index of about 1.6 to about 2.5.

According to at least one example embodiment, a light transmittance of the photoelectronic device may be equal to or greater than 80%.

According to at least one example embodiment, a dark current of the photoelectronic device may be equal to or less than 100 e/s.

According to at least one example embodiment, the array of color filters may include a red color filter, a green color filter and a blue color filter, and wherein each of the color filters has a corresponding red, green or blue pixel sensing devices respectively.

According to at least one example embodiment, the array of color filters includes a red color filter and a blue color filter, and the active layer of the photoelectronic device may include an organic material selectively absorbing a light of green wavelength region.

DETAILED DESCRIPTION

Various example embodiments will be described more fully hereinafter with reference to the accompanying drawings, in which example embodiments of this disclosure are shown. This disclosure may, however, be embodied in many different forms and is not construed as limited to the example embodiments set forth herein. It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

Parts having no relationship with the description are omitted for clarity, and the same or similar constituent elements are indicated by the same reference numeral throughout the specification.

Hereinafter, "combination" may refer to a mixture or a stacked structure of two or more.

Hereinafter, a photoelectronic device according to at least one example embodiment is described referring to FIG. 1.

Figure 1:
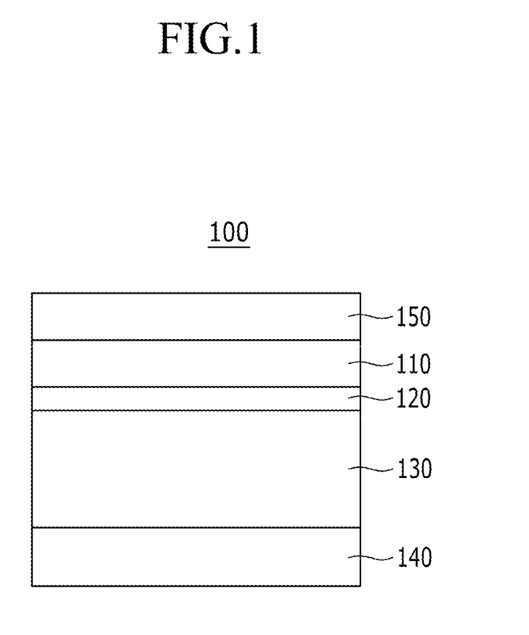
FIG. 1 is a cross-sectional view showing a photoelectronic device according to at least one example embodiment.

FIG. 1 is a cross-sectional view showing a photoelectronic device according to at least one example embodiment.

Referring to FIG. 1, a photoelectronic device 100 according to at least one example embodiment includes a light transmission metal electrode 110, a diffusion barrier layer 120 disposed on one side of the light transmission metal electrode 110, a light transmission auxiliary layer 150 disposed on the other side of the light transmission metal electrode 110, an active layer 130 disposed on one side of the diffusion barrier layer 120, and an opposing electrode 140 disposed on one side of the active layer 130.

According to at least one example embodiment, the light transmission metal electrode 110 may be formed of a first metal transmitting light but absorbing less light and having lower resistance, when the light transmission metal electrode 110 is thin or is formed with a smaller thickness. The first metal may be formed of, for example, silver (Ag), gold (Au), chromium (Cr), germanium (Ge), an alloy thereof, or a combination thereof.

According to at least one example embodiment, the light transmission metal electrode 110 may have a thickness of, for example, about 1 nm to about 500 nm, about 10 nm to about 100 nm, or about 5 nm to about 30 nm. When the light transmission metal electrode 110 has a thickness within the above ranges, light transmittance may not only be secured but conductivity may not be deteriorated and remains good.

According to at least one example embodiment, the light transmission metal electrode 110 may be, for example, thermally deposited using, for example, a metal boat. The thermal deposition of the light transmission metal electrode 110 may partially, substantially or entirely prevent the organic material of the later described active layer 130 from deterioration by plasma generated during the physical deposition process, such as sputtering and the like, and thus partially, substantially or entirely prevent the active layer 130 from degradation during the manufacturing process.

According to at least one example embodiment, the diffusion barrier layer 120 may be disposed on one side of the light transmission metal electrode 110 to directly contact the light transmission metal electrode 110. The diffusion barrier layer 120 may partially, substantially or entirely prevent a first metal of the light transmission metal electrode 110 from being diffused into a lower layer, and accordingly, may be formed of a second metal having a lower thermal diffusivity than the thermal diffusivity of the first metal.

According to at least one example embodiment, the second metal may be selected from a metal having a thermal diffusivity of less than or equal to about $10^{-5}$ m$^2$/s, for example a metal having thermal diffusivity of about $10^{-5}$ m$^2$/s to about $10^{-5}$ m$^2$/s. Such a second metal may include, for example, aluminum (Al), nickel (Ni), cobalt (Co), ruthenium (Ru), palladium (Pd), an alloy thereof, or a combination thereof.

For example, the first metal may be silver (Ag) or a silver alloy, and the second metal may be aluminum (Al) or an aluminum alloy. The silver alloy may be, for example, an alloy of silver (Ag) and molybdenum (Mo), and the aluminum alloy may be, for example, an alloy of aluminum (Al) and molybdenum (Mo).

According to at least one example embodiment, the diffusion barrier layer 120 may be formed as an ultrathin film in a nano-level, instead of a bulk metal layer, and may have, for example a thickness of about 0.5 nm to about 10 nm. Within the above range, the diffusion barrier layer 120 may have a thickness of about 0.8 nm to about 3 nm. When the diffusion barrier layer 120 has a thickness within the range, the first metal of the light transmission metal electrode 110 may be effectively partially, substantially or entirely prevented from being diffused into a lower layer and simultaneously have no influence on charge mobility.

In this way, when the diffusion barrier layer 120 is formed on one side of the light transmission metal electrode 110, a metal forming the light transmission metal electrode 110 may be partially, substantially or entirely prevented from being diffused into a lower layer, and thus a plurality of carrier trap sites may be partially, substantially or entirely prevented from being generated in the lower layer due to the metal diffusion and decrease a leakage current.

According to at least one example embodiment, the light transmission auxiliary layer 150 may be positioned on the side of incident light on the other side of the light transmission metal electrode 110 from the diffusion barrier layer 120. The light transmission auxiliary layer 150 may be disposed on the side of the incident light and may thus decrease a reflectance of the incident light and further improve absorption of the incident light by the photoelectronic device 100.

According to at least one example embodiment, the light transmission auxiliary layer 150 may include, for example, a material having a refractive index of about 1.6 to about 2.5, and for example may include at least one of a metal oxide, a metal sulfide, and an organic material having a refractive index within the above range. The metal oxide may include, for example, tungsten oxide, zinc oxide, indium oxide, tin oxide, indium tin oxide (ITO), indium zinc oxide (IZO), aluminum oxide, aluminum tin oxide (ATO), fluorine-doped tin oxide (FTO), molybdenum oxide, vanadium oxide, rhenium oxide, niobium oxide, tantalum oxide, titanium oxide, nickel oxide, copper oxide, cobalt oxide, manganese oxide, chromium oxide, or a combination thereof, the metal sulfide may include, for example, zinc sulfide (ZnS), and the organic material may include, for example, an amine derivative.

According to at least one example embodiment, the light transmission auxiliary layer 150 may have, for example, a thickness of about 10 nm to about 100 nm.

According to at least one example embodiment, because the light transmission auxiliary layer 150 may not directly contact the active layer 130, the light transmission auxiliary layer 150 may be formed by a physical deposition method such as, for example, sputtering, as well as a thermal deposition method.

According to at least one example embodiment, the active layer 130 includes a p-type semiconductor material and an n-type semiconductor material to form a pn junction, and receives external light, generates excitons, and separates the excitons into holes and electrons. The active layer 130 may include an intrinsic layer including both p-type semiconductors and n-type semiconductors, and may be formed, for example, using a co-deposition method and the like. The active layer 130 may further include at least one selected from a p-type layer and an n-type layer along with the intrinsic layer. The p-type layer includes a p-type semiconductor and the n-type layer includes an n-type semiconductor.

According to at least one example embodiment, the p-type semiconductor may include, for example, N,N'-dimethyl-quinacridone (DMQA), diindenoperylene, dibenzo{[f,f']-4,4',7,7'-tetraphenyl}diindeno[1,2,3-cd:1',2',3'-lm]perylene, and the like, but is not limited thereto. The n-type semiconductor may include, for example, dicyanovinyl-terthiophene (DCV3T), fullerene, a fullerene derivative, perylene diimide, and the like, but is not limited thereto.

According to at least one example embodiment, the opposing electrode 140 may be a reflective electrode or a light transmission electrode, and may be made of, for example, a conductive oxide including at least one of indium tin oxide (ITO), indium zinc oxide (IZO), zinc oxide (ZnO), tin oxide (SnO), aluminum tin oxide (AlTO), and fluorine-doped tin oxide (FTO), or a metal such as aluminum (Al), silver (Ag), copper (Cu), and the like.

Herein, according to at least one example embodiment, when the opposing electrode 140 is a reflective electrode, light may flow in from the light transmission metal electrode 110. On the other hand, when the opposing electrode 140 is a light transmission electrode, light may simultaneously flow in from the light transmission metal electrode 110 and the opposing electrode 140.

According to at least one example embodiment, one of the light transmission metal electrode 110 and the opposing electrode 140 may be an anode and the other may be a cathode. For example, the light transmission metal electrode 110 may be an anode and the opposing electrode 140 may be a cathode.

According to at least one example embodiment, excitons may be generated in the photoelectronic device 100 when light flows in from the light transmission metal electrode 110, or from the opposing electrode 140 and the light transmission metal electrode 110, and the active layer 130 absorbs light in a desired (or, alternatively, predetermined) wavelength region. The excitons are separated into holes and electrons in the active layer 130. The holes move toward an anode while the electrons move toward a cathode, which makes a current flow in the photoelectronic device.

Figure 2:
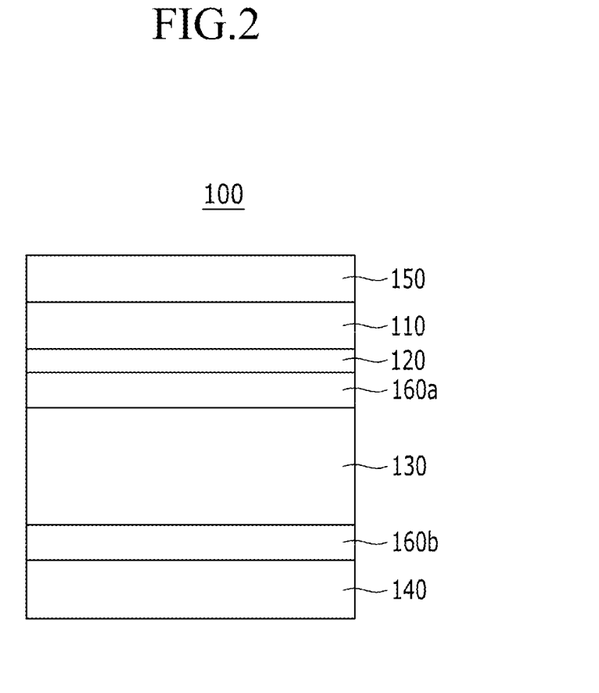
FIG. 2 is a cross-sectional view showing a photoelectronic device according to another example embodiment.

Referring to FIG. 2, a photoelectronic device according to another example embodiment is described.

FIG. 2 is a cross-sectional view showing a photoelectronic device according to another example embodiment.

Referring to FIG. 2, a photoelectronic device 100 according to another example embodiment includes a light transmission metal electrode 110, a diffusion barrier layer 120 disposed on one side of the light transmission metal electrode 110, a light transmission auxiliary layer 150 disposed on the other side of the light transmission metal electrode 110, an active layer 130 disposed on one side of the diffusion barrier layer 120, and an opposing electrode 140 disposed on one side of the active layer 130, and these are all the same as described in the above embodiment.

The photoelectronic device 100 according to this example embodiment further includes a first charge auxiliary layer 160*a* interposed between the active layer 130 and diffusion barrier layer 120, and a second charge auxiliary layer 160*b* interposed between the active layer 130 and opposing electrode 140.

According to at least one example embodiment, the first charge auxiliary layer 160*a* and the second charge auxiliary layer 160*b* facilitate the transport of holes and electrons separated from the active layer 130, and thus increase efficiency of the photoelectronic device 100. The first charge auxiliary layer 160*a* and the second charge auxiliary layer 160*b* may be, for example, at least one selected from a hole injection layer (HIL) for facilitating hole injection, a hole transport layer (HTL) for facilitating hole transport, an electron blocking layer (EBL) for partially, substantially or entirely preventing electron transport, an electron injection layer (EIL) for facilitating electron injection, an electron transport layer (ETL) for facilitating electron transport, and a hole blocking layer (HBL) for partially, substantially or entirely preventing hole transport.

For example, when the light transmission metal electrode 110 is an anode and the opposing electrode 140 is a cathode, the first charge auxiliary layer 160*a* may be a hole injection layer, a hole transport layer and/or an electron blocking layer, the second charge auxiliary layer 160*b* may be an electron injection layer, an electron transport layer, and/or a hole blocking layer.

According to at least one example embodiment, the hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), tungsten oxide (WOx, 0<x≤3), molybdenum oxide (MOx, 1<x<3), vanadium oxide ($V_2O_5$), rhenium oxide, nickel oxide (NiOx, 1<x<4), copper oxide, titanium oxide, molybdenum sulfide, and a combination thereof, but is not limited thereto.

According to at least one example embodiment, the electron blocking layer (EBL) may include one selected from, for example, poly(3,4-ethylene dioxythiophene):poly(styrene sulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

According to at least one example embodiment, the electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, aluminum (Al), magnesium (Mg), molybdenum (Mo), aluminum oxide, magnesium oxide, molybdenum oxide, and a combination thereof, but is not limited thereto.

According to at least one example embodiment, the hole blocking layer (HBL) may include one selected from, for example, 1,4,5,8-naphthalene-tetracarboxylic dianhydride (NTCDA), dicyanovinyl terthiophene (DCV3T), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

According to at least one example embodiment, either one of the first charge auxiliary layer 160*a* and second charge auxiliary layer 160*b* may be omitted.

According to at least one example embodiment, the photoelectronic device may be applied to various fields, for example, a solar cell, an image sensor, a photo-detector, and a photo-sensor, but is not limited thereto.

Hereinafter, an example of an image sensor including the photoelectronic device is described referring to drawings. As an example of an image sensor, an organic CMOS image sensor is described.

Figure 3:
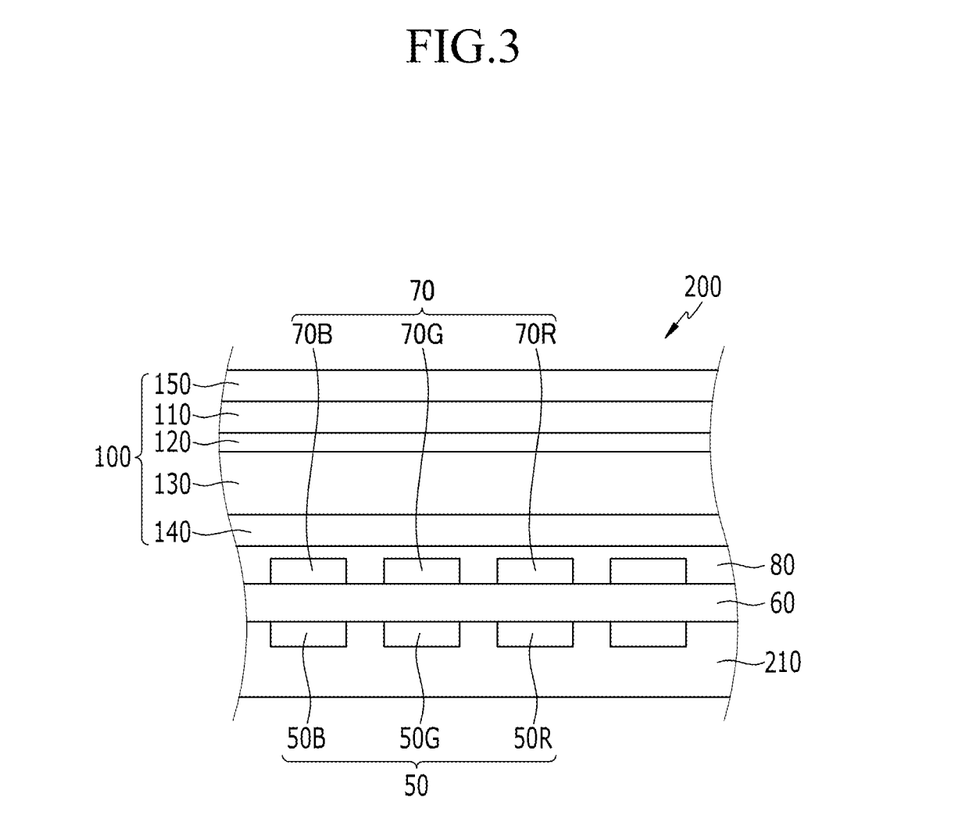
FIG. 3 is a cross-sectional view showing an organic CMOS image sensor according to at least one example embodiment.

FIG. 3 is a cross-sectional view showing an organic CMOS image sensor according to at least one example embodiment.

FIG. 3 describes an example of adjacent blue, green, and red pixels, but is not limited thereto. Hereinafter, a constituent element including "B" in the reference symbol refers to a constituent element included in the blue pixel, a constituent element including "G" refers to a constituent element included in the green pixel, and a constituent element including "R" in the reference symbol refers to a constituent element included in the red pixel.

Referring to FIG. 3, an organic CMOS image sensor 200 may include a semiconductor substrate 210 integrated with a photo-sensing device 50 and a transmission transistor (not shown), a lower insulation layer 60, color filters 70B, 70G, and 70R, an upper insulation layer 80, and a photoelectronic device 100.

According to at least one example embodiment, the semiconductor substrate 210 may be a silicon substrate, and is integrated with the photo-sensing device 50 and a transmission transistor (not shown). The photo-sensing device 50 may be a photodiode. The photo-sensing device 50 and the transmission transistor may be integrated in each pixel, and as shown in the drawing, the photo-sensing device 50 includes a blue pixel photo-sensing device 50B, a green pixel photo-sensing device 50G, and a red pixel photo-sensing device 50R. The photo-sensing device 50 senses light, and the information sensed by the photo-sensing device 50 is transferred by a transmission transistor.

According to at least one example embodiment, metal wires (not shown) and pads (not shown) are formed on the semiconductor substrate 210. In order to decrease signal delay, the metal wires and pads may be made of a metal having lower resistivity, for example, aluminum (Al), copper (Cu), silver (Ag), and alloys thereof, but is not limited thereto.

According to at least one example embodiment, the lower insulation layer 60 is formed on the metal wires and pads. The lower insulation layer 60 may be made of an inorganic insulating material such as silicon oxide and/or silicon nitride, or a low dielectric constant (low K) material such as SiC, SiCOH, SiCO, and SiOF.

According to at least one example embodiment, the lower insulation layer 60 has a trench (not shown) exposing each photo-sensing device 50B, 50G, and 50R of each pixel. The trench may be filled with fillers.

According to at least one example embodiment, a color filter 70 is formed on the lower insulation layer 60. The color filter 70 includes the blue filter 70B formed in the blue pixel, the green filter 70G formed in the green pixel, and the red filter 70R filled in the red pixel. The upper insulation layer 80 is formed on the color filter 70. The upper insulation layer 80 partially, substantially or entirely eliminates a step created by the presence of the color filters 70 and planarizes the surface. The photoelectronic device 100 is formed on the upper insulation layer 80. The photoelectronic device 100 includes a light transmission metal electrode 110, a diffusion barrier layer 120, an active layer 130, and an opposing electrode 140 described above. For the better understanding and ease of description, the photoelectronic device 100 according to at least one example embodiment of the above example embodiments is shown, but it is not limited thereto, and all photoelectronic devices 100 according to all the above example embodiments may be applicable.

According to at least one example embodiment, both the light transmission metal electrode 110 and the opposing electrode 140 may be, for example, a light transmission electrode, and the active layer 130 may include an organic material absorbing light of the visible ray region.

According to at least one example embodiment, the light incident from the light transmission metal electrode 110 may be photoelectrically converted at the active layer 130, may be passed through the opposing electrode 140, and may be sensed by a photo-sensing device 50.

According to at least one example embodiment, the organic CMOS image sensor including the above-described photoelectronic device 100 according to the present example embodiment increases charge mobility between an electrode and an active layer to secure photoelectric conversion efficiency (EQE), and also decreases a current in a reverse bias state, that is to say, a leakage current, to improve sensing performance by sensing a current produced by light.

Figure 4:
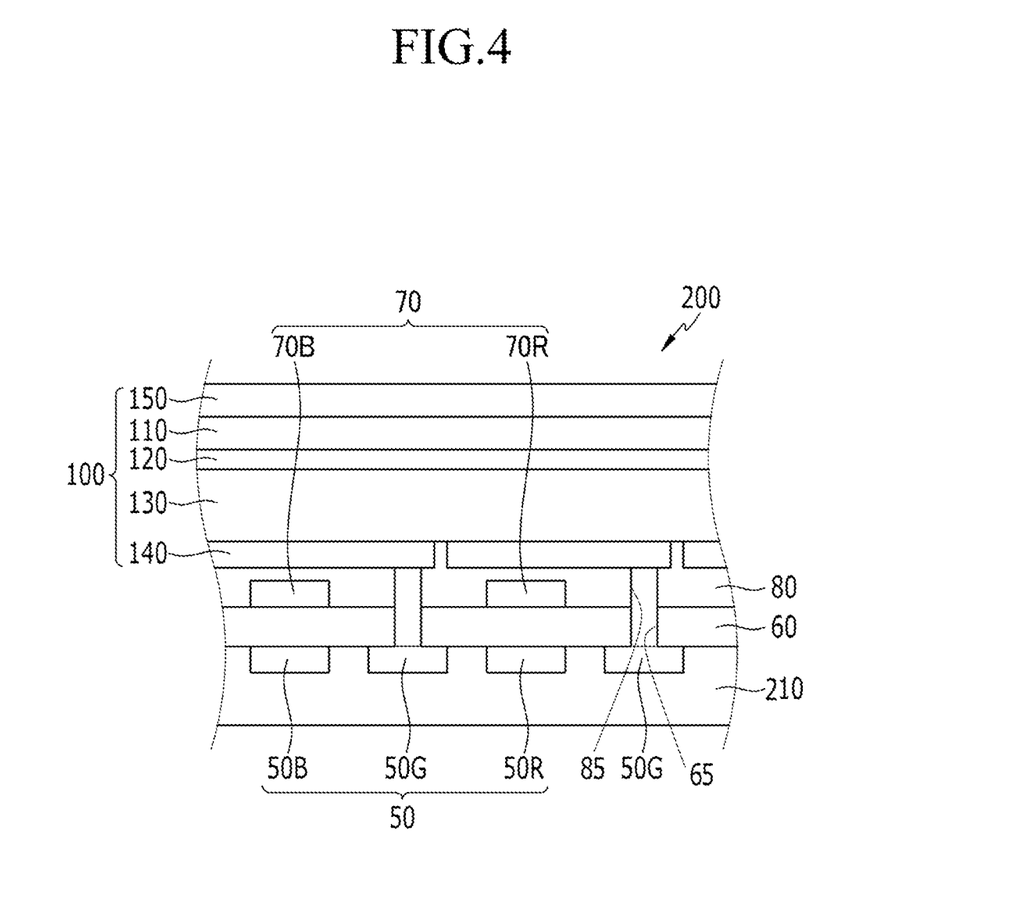
FIG. 4 is a cross-sectional view showing an organic CMOS image sensor according to another example embodiment.

FIG. 4 is a cross-sectional view showing an organic CMOS image sensor according to another example embodiment.

According to at least one example embodiment, the organic CMOS image sensor 200 according to an example embodiment includes a semiconductor substrate 210 integrated with a photo-sensing device 50, and a transmission transistor (not shown), a lower insulation layer 60, a color filter 70, an upper insulation layer 80, and a photoelectronic device 100, as above.

The organic CMOS image sensor 200 according to an example embodiment may omit the green filter 70G, different from the above example embodiment, and instead may substitute the active layer 130 of the photoelectronic device 100 for the green filter 70G. The active layer of the photoelectronic device 100 may include, for example, an organic material mainly absorbing light in a green wavelength region, and the light incident from the light transmission metal electrode 110 may be photoelectrically converted by mainly absorbing light in the green wavelength region at the active layer 130, while light in the other wavelength regions is passed through the opposing electrode 140 and sensed by a photo-sensing device 50. The upper insulation layer 80 and the lower insulation layer 60 have through-holes 85 to expose a photo-sensing device 50G of a green pixel.

According to at least one example embodiment, when the active layer 130 of the photoelectronic device 100 includes an organic material that mainly absorbs a light of a red wavelength region and an organic material that mainly absorbs a light of a blue wavelength region, a red filter 70R or a blue filter 70B may be substituted for the active layer 130.

Hereinafter, various embodiments are illustrated in more detail with reference to examples. However, these embodiments are examples, and the present disclosure is not limited thereto.

Manufacture of Photoelectronic Device 1

Example 1

According to at least one example embodiment, an ITO is sputtered on a glass substrate to form a 100 nm-thick lower electrode. On the lower electrode, a mixture of molybdenum oxide (MoOx, 0<x≤3) and aluminum (Al) is thermally deposited in a ratio of 1:1 (wt/wt) to form a 5 nm-thick lower charge auxiliary layer. On the charge auxiliary layer, dicyanovinyl-terthiophene (DCV3T) and dicyanovinyl-terthiophene (DCV3T):N,N'-dimethylquinacridone (DMQA) (1:1) are sequentially deposited to form an active layer of 10 nm thick and 110 nm thick, respectively. On the active layer, a molybdenum oxide (MoOx, 0<x≤3) is thermally deposited to form a 20 nm thick upper charge auxiliary layer. On the upper charge auxiliary layer, aluminum (Al) (a thermal diffusion coefficient: $8.1 \times 10^{-5}$ m$^2$/s) is thermally deposited to form a 1 nm-thick diffusion barrier layer, and silver (Ag) (thermal diffusion coefficient: $1.6 \times 10^{-4}$ m$^2$/s) is thermally deposited to form an 11 nm-thick upper electrode. Then, on the upper electrode, tungsten oxide (WOx, 0<x≤3) is deposited to form a 30 nm-thick light transmission auxiliary layer, fabricating a photoelectronic device.

Comparative Example 1

A photoelectronic device is fabricated according to the same method as Example 1, except for forming no diffusion barrier layer.

Comparative Example 2

A photoelectronic device is fabricated according to the same method as Example 1, except for forming no light transmission auxiliary layer.
Evaluation
Evaluation 1

The photoelectronic devices according to Example 1 and Comparative Example 1 are evaluated regarding dark current.

The dark current is evaluated by applying a reverse bias to the photoelectronic devices according to Example 1 and Comparative Example 1 and measuring current change thereof depending on a voltage.

Figure 5:
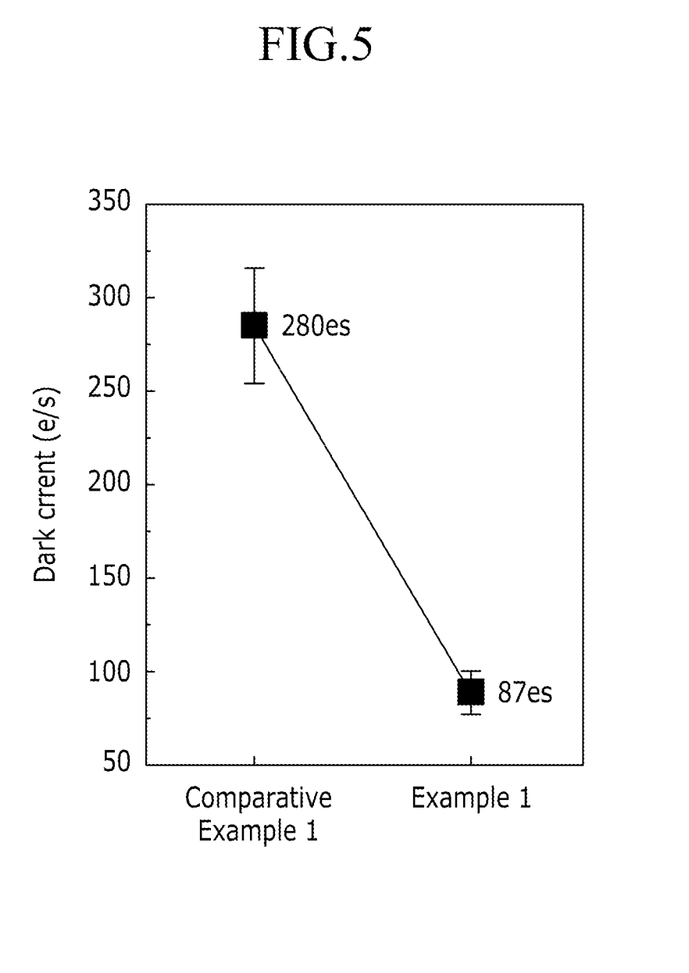
FIG. 5 is a graph showing a dark current of the photoelectronic device according to Example 1 and Comparative Example 1.

The results are provided in FIG. 5.

FIG. 5 is a graph showing the dark current of the photoelectronic devices according to Example 1 and Comparative Example 1.

Referring to FIG. 5, the photoelectronic device according to Example 1 has sharply lower dark current compared with the photoelectronic device according to Comparative Example 1. In particular, the dark current of the photoelectronic device according to Example 1 is equal to or less than about 100 e/s and is less than one third compared with that of the photoelectronic device according to Comparative Example 1. The photoelectronic device according to Example 1 includes a diffusion barrier layer, and results in a sharply lowered dark current.

Evaluation 2

The photoelectronic devices according to Example 1 and Comparative Example 1 are evaluated regarding external quantum efficiency (EQE), while various voltages are applied thereto.

Figure 6:
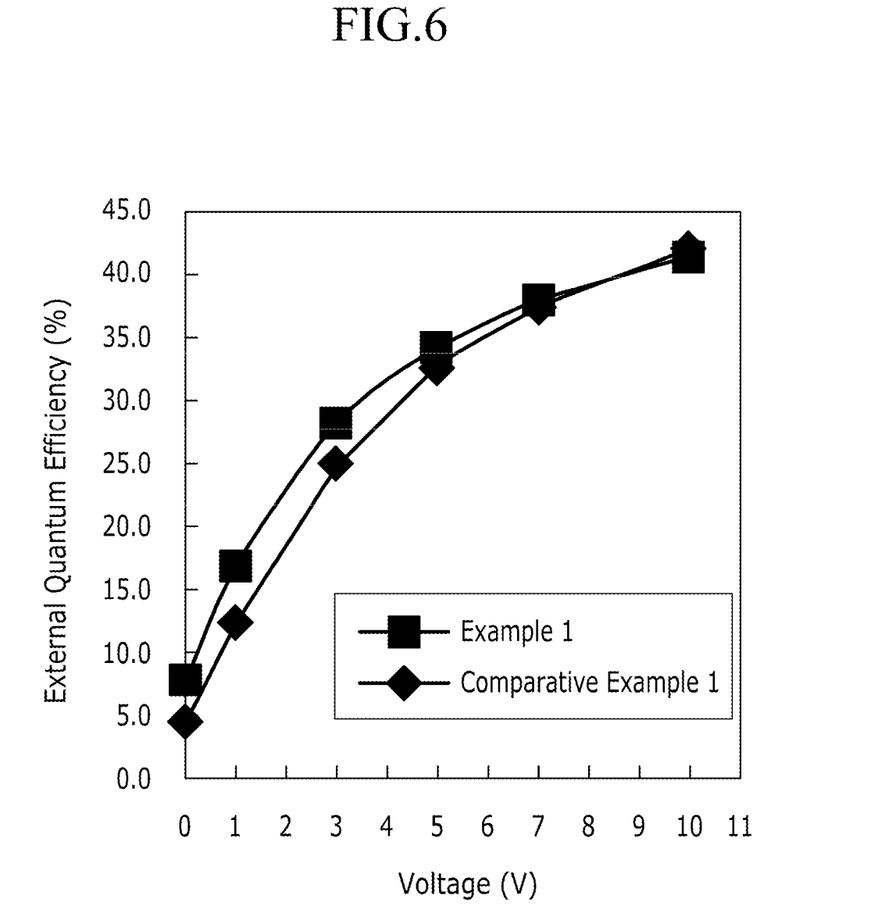
FIG. 6 is a graph showing external quantum efficiency (EQE) of the photoelectronic devices according to Example 1 and Comparative Example 1.

The results are provided in FIG. 6.

FIG. 6 is a graph showing external quantum efficiency (EQE) of the photoelectronic devices according to Example 1 and Comparative Example 1 depending on a wavelength.

Referring to FIG. 6, the photoelectronic device according to Example 1 has similar or improved external quantum efficiency (EQE) compared with the EQE of the photoelectronic device according to Comparative Example 1. Accordingly, the photoelectronic device according to Example 1 further includes a diffusion barrier layer and has almost no influence on external quantum efficiency (EQE).

Evaluation 3

The photoelectronic devices according to Example 1 and Comparative Example 2 are evaluated regarding light transmittance.

The light transmittance is measured using a UV-visible spectrophotometry method.

The results are provided in Table 1.

TABLE 1

| | Light transmittance (@ 540 nm) (%) |
| --- | --- |
| Example 1 | 85 |
| Comparative Example 2 | 60 |

Referring to Table 1, the photoelectronic device according to Example 1 has a remarkably improved light transmittance compared to the photoelectronic device according to Comparative Example 2.

Based on the results, the photoelectronic device according to Example 1 results in a light transmittance that is greater than or equal to 80% but has no influence on external quantum efficiency (EQE) and improves leakage current.

While this disclosure has been described in connection with what is presently considered to be practical example embodiments, it is to be understood that the example embodiments are not limited to the disclosed embodiments, but, on the contrary, is intended to cover various modifications and equivalent arrangements included within the spirit and scope of the appended claims.

What is claimed is:

1. An organic image sensor, comprising:
an array of photo-sensing devices;
an array of color filters the array of color filters consisting of red color filters and blue color filters; and
a photoelectronic device for converting light into an electrical signal;
wherein the photoelectronic device includes,
a Ag electrode including Ag or a Ag alloy,
an Al metal layer on one side of the Ag electrode and consisting of Al, the Al metal layer being directly in contact with the Ag electrode, the Al metal layer having a thickness of about 0.5 nm to about 3 nm,
an active layer on one side of the Al metal layer such that the active layer and the Ag electrode are not in contact, the active layer including an organic material, the active layer being configured to selectively absorb a light of green wavelength region and generate excitons based on the absorbed light of green wavelength region,
an opposing electrode on one side of the active layer, and
a light transmission auxiliary layer on the other side of the Ag electrode, the light transmission auxiliary layer including tungsten oxide, zinc oxide, indium oxide, tin oxide, aluminum oxide, aluminum tin oxide, fluorine-doped tin oxide, molybdenum oxide, vanadium oxide, rhenium oxide, niobium oxide, tantalum oxide, titanium oxide, nickel oxide, copper oxide, cobalt oxide, manganese oxide, chromium oxide, metal sulfide, or a combination thereof.

2. The organic image sensor of claim 1, wherein the Ag electrode has a thickness of about 1 nm to about 100 nm.

3. The organic image sensor of claim 1, wherein a light transmittance of the photoelectronic device is equal to or greater than 80%.

4. The organic image sensor of claim 1, wherein a dark current of the photoelectronic device is equal to or less than 100 e/s.

5. The photoelectronic device of claim 1, wherein the active layer comprises a p-type semiconductor material and an n-type semiconductor material to form a pn junction.

6. The organic image sensor of claim 1, wherein the active layer comprises at least one of N,N'-dimethyl-quinacridone (DMQA), diindenoperylene, dibenzo{[f,f]-4,4',7,7'-tetraphenyl}diindeno[1,2,3-cd:1',2',3'-lm]perylene, dicyanovinyl-terthiophene (DCV3T), fullerene, a fullerene derivative, and perylene diimide.

7. The organic image sensor of claim 1, further comprising a through-hole connecting the opposing electrode and a green pixel photo-sensing device of the array of photo-sensing devices.

* * * * *